United States Patent
Ng

(10) Patent No.: US 9,054,485 B1
(45) Date of Patent: Jun. 9, 2015

(54) ASYMMETRIC EDGE COMPENSATION OF BOTH ANODE AND CATHODE TERMINALS OF A VERTICAL-CAVITY SURFACE-EMITTING LASER (VCSEL) DIODE

(71) Applicant: Hong Kong Applied Science & Technology Research Institute Company Limited, Hong Kong (HK)

(72) Inventor: Kwan Ting Ng, Hong Kong (HK)

(73) Assignee: Hong Kong Applied Science & Technology Research Institute Company, Ltd., Hong Kong (HK)

( * ) Notice: Subject to any disclaimer, the term of this patent is extended or adjusted under 35 U.S.C. 154(b) by 0 days.

(21) Appl. No.: 14/488,444

(22) Filed: Sep. 17, 2014

(51) Int. Cl.
  *H01S 3/13* (2006.01)
  *H01S 5/042* (2006.01)
  *H01S 5/183* (2006.01)

(52) U.S. Cl.
  CPC ............... *H01S 5/042* (2013.01); *H01S 5/183* (2013.01)

(58) Field of Classification Search
  CPC ..... H01S 3/0912; H01S 5/0428; H01S 3/067; H01S 5/0261; H01S 5/0427; H01S 5/068; H01S 5/06808
  USPC ........................ 372/29.012, 29.015
  See application file for complete search history.

(56) References Cited

U.S. PATENT DOCUMENTS

| 4,647,792 | A * | 3/1987 | Meslener et al. ............ 327/109 |
| 2008/0138089 | A1* | 6/2008 | Tokita et al. .................. 398/183 |
| 2008/0253414 | A1 | 10/2008 | Bock |
| 2012/0224849 | A1 | 9/2012 | Rylyakov et al. |
| 2013/0121356 | A1* | 5/2013 | Sugawara .................. 372/38.02 |

OTHER PUBLICATIONS

Toru Yoshizawa ("Handbook of Optical Metrology: Principles and Applications", section 1.4.7.2,p. 58, Feb. 25, 2009 by CRC Press, ISBN 9780849337604—CAT# DK6042).*
S.B Scruby ("Laser Ultrasonics Techniques and Applications", section 1.2.4, p. 17, Jan. 1, 1990 by CRC Press, ISBN-10: 1845697359).*

(Continued)

*Primary Examiner* — Tod T Van Roy
*Assistant Examiner* — Vu A Vu
(74) *Attorney, Agent, or Firm* — Stuart T. Auvinen; gPatent LLC

(57) ABSTRACT

A laser driver circuit compensates for non-linear behavior of Vertical-Cavity Surface-Emitting Laser (VCSEL) devices. A VCSEL has an internal parasitic capacitance that is charged while the VCSEL is on. When the VCSEL turns off, this internal parasitic capacitor discharges, keeping the VCSEL on longer, increasing the physical turn-off or fall time. The laser driver circuit compensates for the slower fall time by modulating both anode and cathode terminals of the VCSEL as the VCSEL is turned on and off. Both plates of the internal parasitic capacitor are discharged at turn off, cutting the parasitic discharge time in half. A cathode driver transistor modulates the cathode voltage while a source-follower transistor modulates the anode voltage. A modulating current may be switched using a current mirror structure. Multiple source-follower transistors may be selectable in parallel, with switches to select the total anode current, allowing for programmable compensation of the fall time.

18 Claims, 9 Drawing Sheets

(56) References Cited

OTHER PUBLICATIONS

Ohhata, et al., "Design of a 4×10Gbps VCSEL driver using asymmetric emphasis technique in 90nm CMOS for optical interconnection", IEEE Trans. On Microwave and Techniques, vol. 58, May 2010, pp. 1107-1115.

Kromer, et al., "A 100mW 4×10Gbps transceiver in 80nm CMOS for high density optical interconnects", JSSC, vol. 40, Dec. 2005, pp. 2667-2679.

\* cited by examiner

CATHODE MODULATION ONLY

ANODE & CATHODE MODULATION

ASYMMETRIC EDGE COMPENSATION OF BOTH ANODE AND CATHODE TERMINALS OF A VERTICAL-CAVITY SURFACE-EMITTING LASER (VCSEL) DIODE

FIELD OF THE INVENTION

This invention relates to laser driver circuits, and more particularly to VCSEL drivers with asymmetrically sharpened edges.

BACKGROUND OF THE INVENTION

Lasers are used in a variety of applications, such as laser engraving, hair removal, cleaning, optical communications, and many industrial applications. Lasers are especially useful as transmitters for high-speed optical communication transmitters.

Coherent laser light may be generated by a laser diode fabricated from semiconductor materials. Laser diodes that emit light in a direction parallel to the surface of the wafer require breaking the wafer before testing, resulting in high production and packaging costs.

Surface-emitting laser diodes are preferred because they can be tested at wafer sort, before individual laser diodes are separated and packaged. Bad laser diodes are not packaged, resulting in lower costs. A widely available type of laser is known as a Vertical-Cavity Surface-Emitting Laser (VCSEL).

Electrical current flowing through the VCSEL laser diode generates laser light. However, the optical power is a non-linear function of the current flow through the VCSEL. A VCSEL device tends to have a fast turn-on (rise) time but a slow turn-off (fall) time. Parasitic capacitances in the VCSEL are slowly discharged through parasitic resistances in the VCSEL, causing the VCSEL to remain on for a period of time after it is turned off, resulting in a slow fall time.

Various laser driver circuits have been used to drive current through VCSELs. Common-cathode driver circuits are less desirable due to large parasitics on the PMOS driver transistor connected to the anode. Common-anode laser drivers are more widely used due to lower parasitics of NMOS transistors connected to the cathode.

FIGS. 1A-1B show a common-anode VCSEL driver. The positive or anode terminal of VCSEL 10 is connected to a common power supply. The current through the negative or cathode terminal of VCSEL 10 passes through transistor 16. Transistor 16 is switched by gate voltage VG to increase or decrease the current through VCSEL 10. In FIG. 1A, VG is high, and transistor 16 is on, allowing a large current to be pulled through VCSEL 10, which emits laser light at a high optical power.

In FIG. 1B, VG is switched low, turning transistor 16 off. A small bias current (not shown) may still flow through transistor 16, or through another component (not shown) to bias cathode voltage V_VCATHODE to a desired off voltage. Ideally, the light produced by VCSEL should immediately decrease to near-zero when VG is switched from high to low. However, the physical VCSEL device does not respond in an ideal manner. Instead, VCSEL 10 continues to outputs some light for a short period of time after current stops flowing through transistor 16.

This non-ideal behavior of VCSEL 10 can be modeled by parasitic capacitor 14 and parasitic resistor 12 that are each in parallel with the ideal laser diode shown as VCSEL 10. When VCSEL 10 is on (FIG. 1A), parasitic capacitor 14 is being charged by an excess of negative electrons on its lower plate. When transistor 16 turns off (FIG. 1B), the negative charge stored on parasitic capacitor 14 is discharged through parasitic resistor 12. Since parasitic resistor 12 and parasitic capacitor 14 are not real devices, but are part of the physical VCSEL device, the electrons stored on parasitic capacitor 14 really flow through the laser diode of VCSEL 10, causing VCSEL to emit light.

The amount of time that VCSEL 10 emits light after it is turned off can be modeled by the R-C time constant of parasitic capacitor 14 and parasitic resistor 12. Thus the slow turn-off of VCSEL 10 can be explained by electrons flowing from the bottom plate of parasitic capacitor 14, through parasitic resistor 12 to the power supply (anode).

FIGS. 2A-B show the effects modeled by the parasitic capacitor and resistor in a VCSEL. In FIG. 2A, the voltage across VCSEL 10 is low when the laser diode is turned off, but high when the laser diode is turned on, and a larger current is flowing through the laser diode. The rise time (TR) to turn on VCSEL 10 is relatively short. However, the fall time (TF) is longer. The voltage across VCSEL 10 decreases slowly because parasitic capacitor 14 has been charged while VCSEL was on, and much be slowly discharged through parasitic resistor 12. Parasitic capacitor 14 causes the voltage across VCSEL 10 to be larger that it ideally would be as VCSEL turns off. Optically, some light would continue to be observed from VCSEL 10 during TF. This is undesirable.

FIG. 2B shows an eye diagram. When viewing on a scope or other instrument, the rising and falling waveforms may be superimposed over each other. The fall time is somewhat slower than the rise time, as can be seen in the eye diagram. The eye diagram waveform is not exactly symmetrical, but is skewed by the slow fall time.

FIG. 3 shows voltage and current characteristics of the common-anode laser-driver circuit of FIGS. 1A-1B. When the gate voltage VG of transistor 16 is high, VCSEL 10 is on, allowing a high diode current I_DIODE to flow through. The voltage across VCSEL 10 is V_ON, which is the difference between anode voltage V_ANODE and cathode voltage V_CATHODE.

When gate voltage VG is driven low, transistor 16 turns off. Diode current that is flowing through VCSEL 10 causes the cathode voltage V_CATHODE to rise since the cathode node is no longer being discharged to ground by transistor 16. As the cathode voltage rises, the voltage across VCSEL 10 decreases, causing the diode current to decrease. Eventually the cathode voltage rises enough that the voltage across VCSEL is below its turn-on voltage VOFF and diode current stops. The diode current I_DIODE turns off slowly due to the R-C time constant of the parasitic resistor and capacitor in the physical VCSEL device.

FIG. 4 shows frequency chirping of a VCSEL device. As the frequency of operation of the VCSEL device is increased, eventually an undesirable phenomenon known as chirping occurs. As FIG. 4 shows, the optical power initially spikes too high as the VCSEL is turned on at high frequency. At very high frequencies, inherent physical characteristics of VCSEL devices cause frequency chirping.

What is desired is a laser driver circuit tailored for driving VCSELs. A VCSEL driver circuit is desired that compensates for non-linear behavior of a physical VCSEL device. A VCSEL driver circuit that compensates for the slow turn-off of a VCSEL is desirable. A VCSEL driver that can operate at high frequencies is desirable.

DETAILED DESCRIPTION

The present invention relates to an improvement in VCSEL driver circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that the slow physical turn-off of a VCSEL device can be compensated for by sharpening the falling edge but not sharpening the rising edge of the output of the driver circuit. An asymmetric driver circuit provides a faster fall time while maintaining a fast rise time. When combined with a physical VCSEL device, the asymmetric driver circuit provides balanced rise and fall times of optical power from the VCSEL device.

Figure 3:
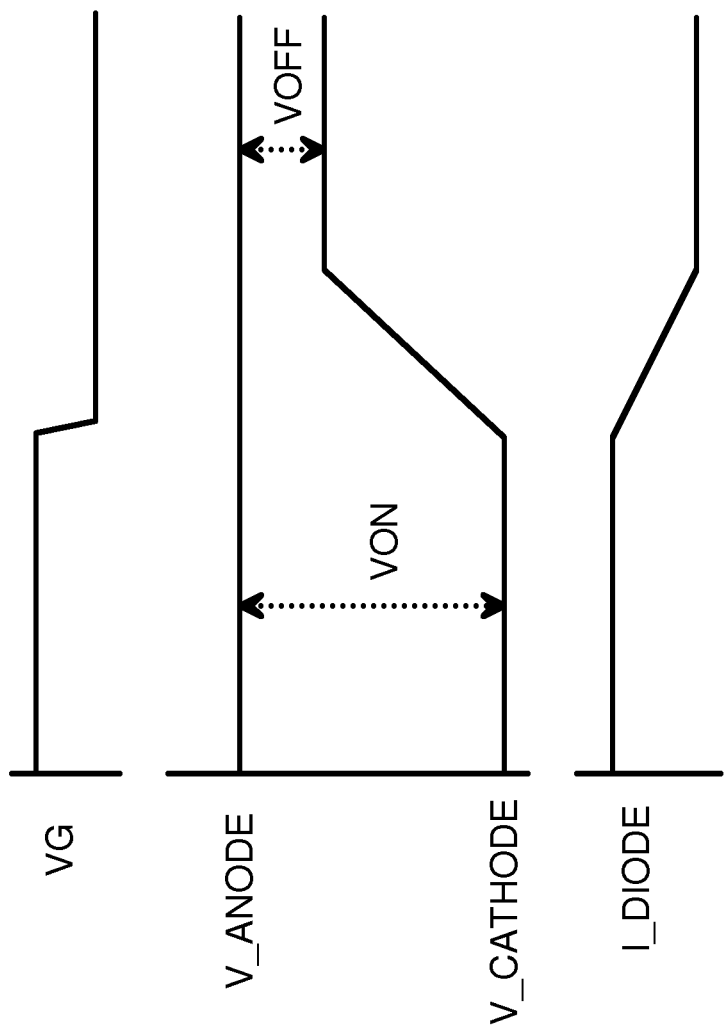
FIG. 3 shows voltage and current characteristics of the common-anode laser-driver circuit of FIGS. 1A-1B.
Figure 4:
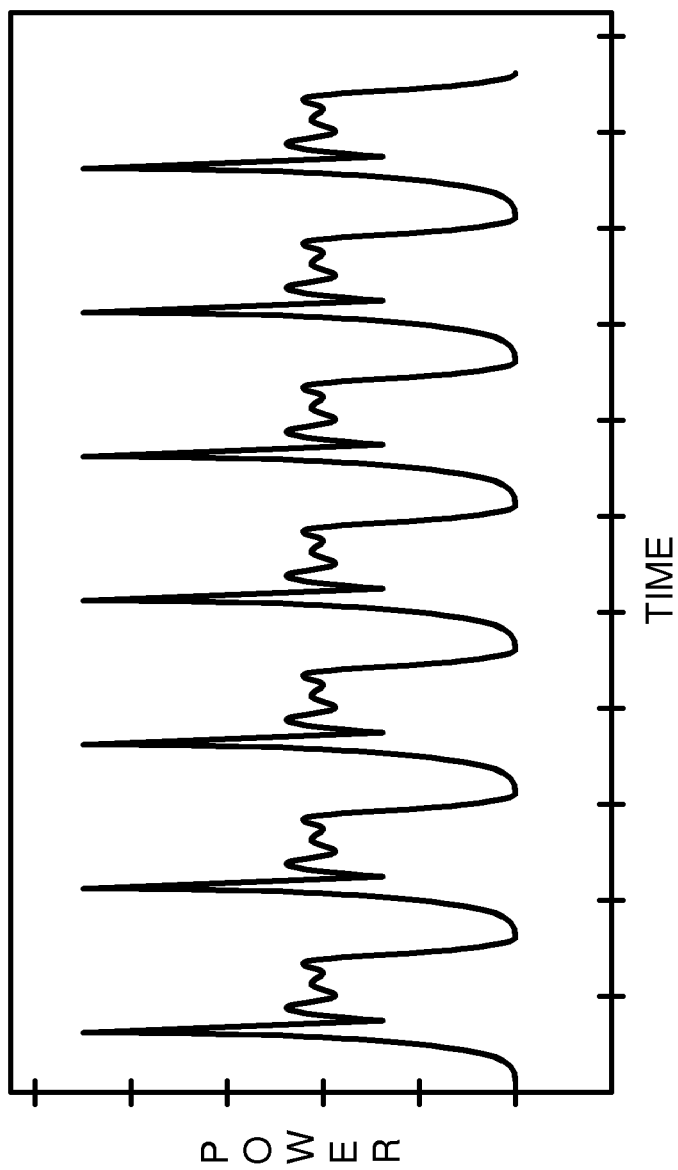
FIG. 4 shows frequency chirping of a VCSEL device.

The inventor further realizes that a common-anode driver circuit modules the cathode terminal of the VCSEL, but the anode voltage is not modulated. FIG. 3 shows that V_ANODE is constant while only V_CATHODE is modulated (1-terminal modulation). The inventor proposes to modulate both anode and cathode nodes (2-terminal modulation). By modulating both anode and cathode terminals of the VCSEL, the VCSEL can be turned off more quickly, thus enhancing the fall time.

Figure 5:
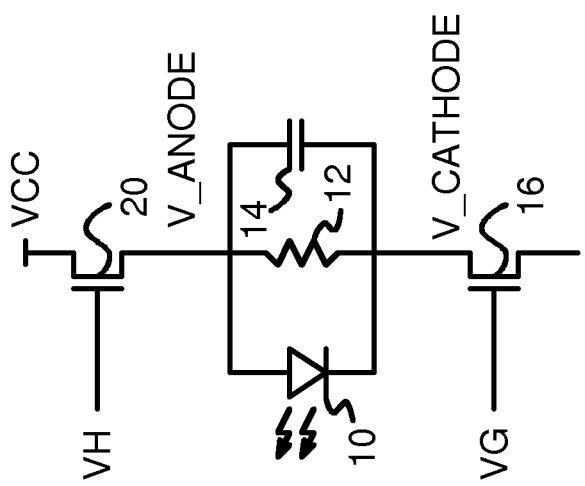
FIG. 5 shows a VCSEL driver with 2-terminal modulation.

FIG. 5 shows a VCSEL driver with 2-terminal modulation. The cathode terminal of VCSEL 10 is modulated by cathode driver transistor 16, while the anode terminal of VCSEL 10 is modulated by source-follower transistor 20. The gate of cathode driver transistor 16 is VG, while the gate of source-follower transistor 20 is VH. Both VG and VH go high at the same time, and both go low at the same time, although VH may be biased to a higher voltage than VG.

Parasitic capacitor 14 can be actively discharged from both plates, rather than from just one plate, since both terminals of parasitic capacitor 14 can have their voltages adjusted. Shutting off both transistors 16, 20 at the same time allows both plates of parasitic capacitor 14 to float, so current does not have to flow from parasitic capacitor 14 through parasitic resistor 12. VCSEL 10 can turn off more quickly without the parasitic effects.

Figure 6:
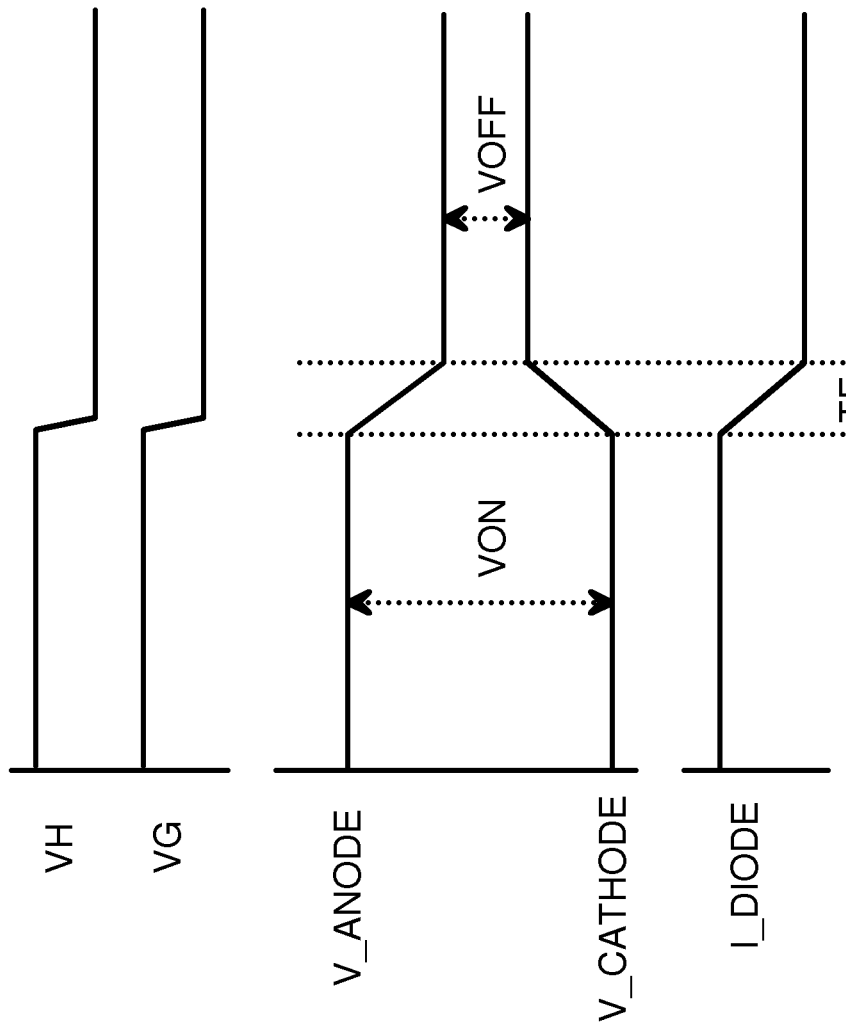
FIG. 6 is a waveform of operation of the 2-terminal modulation VCSEL driver of FIG. 5.

FIG. 6 is a waveform of operation of the 2-terminal modulation VCSEL driver of FIG. 5. Initially, both VG and VH are high, and transistors 16, 20 are both on, allowing a large diode current to flow through VCSEL 10. The voltage difference between the anode and cathode terminals of VCSEL 10 is relatively large, VON.

VG and VH are both switched low at about the same time. Cathode driver transistor 16 turns off, allowing the cathode node voltage V_CATHODE to rise as diode current flowing into the cathode node accumulates on parasitics capacitances of the cathode node.

Similarly, source-follower transistor 20 turns off, causing the anode terminal to no longer be drive high to VCC. Anode voltage V_ANODE can drop as positive charge flows through VCSEL 10, reducing the amount of positive charged stored on the top plate of parasitic capacitor 14. Since less positive charge is stored on the top plate of parasitic capacitor 14 as V_ANODE falls, less negative charge from the bottom plate of parasitic capacitor 14 needs to be discharged through parasitic resistor 12. Allowing the anode and cathode voltages to both float may allow charge to more quickly equalize between anode and cathode terminals of parasitic capacitor 14, thus reducing the fall time TF.

The off voltage difference V_OFF across VCSEL 10 is achieved by both V_CATHODE rising and V_ANODE falling. A smaller voltage swing is required of V_CATHODE than shown for the 1-terminal modulation of FIG. 3, since V_ANODE falls to meet V_CATHODE halfway.

Figure 7:
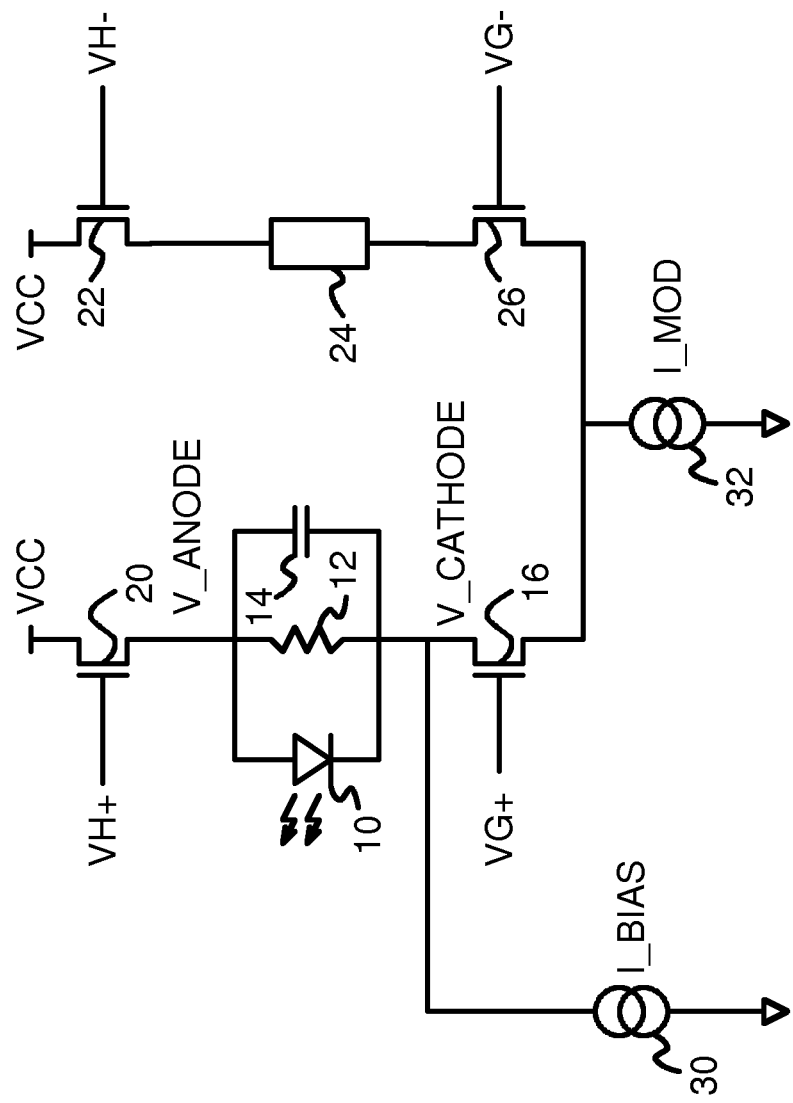
FIG. 7 is a schematic of a VCSEL driver with 2-terminal modulation.

FIG. 7 is a schematic of a VCSEL driver with 2-terminal modulation. While FIG. 5 conceptually highlights 2-terminal modulation, FIG. 7 shows a practical circuit in more detail.

VCSEL 10 is a Vertical-Cavity Surface-Emitting Laser (VCSEL) diode that includes parasitic resistor 12 and parasitic capacitor 14, which are not separate physical components but are part of the physical VCSEL. The anode terminal of VCSEL 10 connects to power supply VCC through source-follower transistor 20, which has a gate controlled by control voltage VH+. The cathode terminal of VCSEL 10 connects to cathode driver transistor 16 which has a gate controlled by control voltage VG+.

A modulating current I_MOD is generated by modulating current source 32. I_MOD remains constant, but is pulled through either cathode driver transistor 16 or through mirror driver transistor 26. Mirror driver transistor 26 has a gate controlled by control voltage VG−, which controls current pulled through dummy load 24. Dummy load 24 has about the same resistance as parasitic resistor 12, which models the resistance of the VCSEL. Mirror source-follower transistor 22 has a gate controlled by control voltage VH−, and has a source connected to dummy load 24.

The electrical properties of Mirror source-follower transistor 22, dummy load 24, and Mirror driver transistor 26 are designed to match those of source-follower transistor 20, the VCSEL, and cathode driver transistor 16, although absolute sizes may be scaled in other embodiments.

When VH+ and VG+ are high, then VH− and VG− are lower. Source-follower transistor 20 and cathode driver transistor 16 are on, driving current through VCSEL 10. More of modulating current I_MOD is steered through cathode driver transistor 16 than through mirror driver transistor 26. The current through VCSEL 10 can be approximated as I_BIAS+ I_MOD.

When VH+ and VG+ are low, then VH− and VG− are higher. Source-follower transistor 20 and cathode driver transistor 16 are off, driving little or no current through VCSEL 10. More of modulating current I_MOD is steered through mirror driver transistor than through 26 cathode driver transistor 16. The current through VCSEL 10 can be approximated as I_BIAS.

Bias current source 30 pulls a constant bias current I_BIAS through VCSEL 10. This bias current I_BIAS is independent of I_MOD. The bias current that is pulled through VCSEL 10 biases the cathode and anode terminals to desired values (such as shown in FIG. 6) when cathode driver transistor 16 is turned off. For example, I_BIAS can be a sub-threshold current that is just below the turn-on or inflexion point on an I-V curve for VCSEL 10. Thus VCSEL 10 is biased off but just below the turn-on point, allowing for a faster turn-on than if VCSEL 10 were biased to zero current.

Two currents flow through VCSEL 10, I_BIAS and I_MOD. Some or all of I_MOD is switched on and off by cathode driver transistor 16 while I_BIAS constantly flows through VCSEL 10.

The slow falling edge of VCSEL 10 is compensated for by 2-terminal modulation. Both the cathode and anode terminals of VCSEL 10 are modulated, allowing charge to be discharged from both terminals of parasitic capacitor 14, rather than from only one terminal of parasitic capacitor 14. The discharge time is roughly cut in half by allowing V_ANODE to slew lower, discharging the capacitor from both plates, and reducing the effective R-C delay on turn off.

The charge on parasitic capacitor 14 may be partially discharged by source-follower transistor 20. The circuit may be designed so that source-follower transistor 20 remains slightly on rather than completely off during the off state when VH+ is low. The off voltage for VH+ may be selected so that source-follower transistor 20 remains on, but with a higher on resistance and with a lower drain current than when in the on state. During the off state, as V_ANODE falls, the gate-to-source voltage of source-follower transistor 20 increases slightly (or falls less) with the lower source voltage, even as the gate voltage falls. If source-follower transistor 20 is initially shut off by its gate voltage VH+ falling, it can turn slightly on again as its source, V_ANODE, falls. Thus charge on parasitic capacitor 14 may be discharged through source-follower transistor 20 even when source-follower transistor 20 is in the off state.

Frequency chirping is avoided by not sharpening the rising edge. Only the slower falling edge is sharpened.

Figure 8:
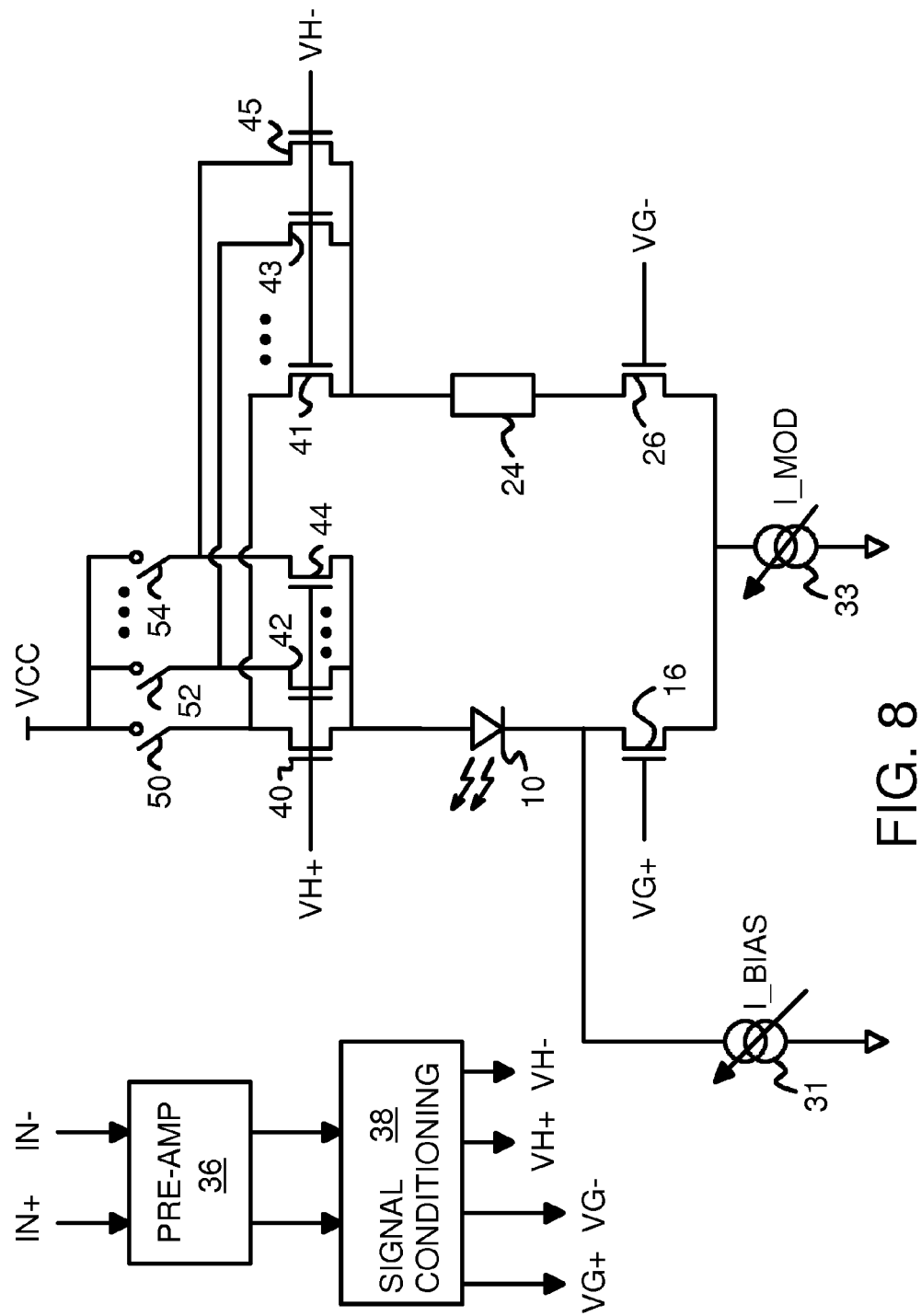
FIG. 8 is a diagram of an adjustable-current 2-terminal modulation laser driver.

FIG. 8 is a diagram of an adjustable-current 2-terminal modulation laser driver. Modulating current source 33 has an adjustable modulating current I_MOD that may be set by programming configuration registers, fuses, external resistors, or other methods. Likewise, bias current source 30 is adjustable or programmable, allowing the bias operating point for VCSEL 10 to be adjusted. Adjusting the bias current is especially useful since the diode current is exponentially related to the anode and cathode voltage difference.

I_MOD and I_BIAS may be adjusted to adapt the driver circuit for different kinds of VCSEL. For example, some manufacturers of VCSEL may have higher diode currents than others, or require higher VON and lower VOFF. The bias point for each manufacturer's VCSEL may differ yet the circuit can adjust for these differences in VCSEL specifications.

VG+ and VG− switch modulating current I_MOD using cathode driver transistor 16 and mirror driver transistor 26 so that I_MOD alternately flows through VCSEL 10 and dummy load 24.

The amount of edge compensation can be adjusted by adjusting the effective size of source-follower transistor 20.

The size of mirror source-follower transistor 22 is also adjusted to match or mirror the size of source-follower transistor 20.

Source-follower transistor 20 is replaced by several programmable source-follower transistors 40, 42 . . . 44. VH+ is applied to the gates of programmable source-follower transistors 40, 42, . . . 44, while VH− is applied to the gates of programmable mirror source-follower transistors 41, 43, . . . 45. Each of programmable source-follower transistors 40, 42, . . . 44 has its drain connected to VCC through one of switches 50, 52, . . . 54. Digital control signals, such as from a programmable configuration register, are applied to control each of switches 50, 52, . . . 54.

Switches 50, 52, . . . 54 also connect to the drains of programmable mirror source-follower transistors 41, 43, . . . 45. Each of switches 50, 52, . . . 54 selects one pair of programmable source-follower transistors 40, 42, . . . 44 and programmable mirror source-follower transistors 41, 43, . . . 45 to be enabled or connected to VCC. Others of switches 50, 52, . . . 54 may be turned off, blocking their programmable source-follower transistors 40, 42, . . . 44 and programmable mirror source-follower transistors 41, 43, . . . 45 from being connected to VCC and thus disabling them.

For example, when switch 50 is enabled but switches 52, 54 are disabled, programmable source-follower transistor 40 connects to VCSEL 10, but programmable source-follower transistors 42, . . . 44 are effectively disabled, since source current from VCC is blocked by switches 52, 54 being open.

Control voltage VH+ is driven to the gates of programmable source-follower transistors 40, 42, . . . 44 and turns on enabled source-follower transistors to drive diode current to VCSEL 10 when VH+ is high. The total current supplied by programmable source-follower transistors 40, 42, . . . 44 is the sum of individual currents through enabled transistors 40, 42, . . . 44. Thus the current through the source-follower transistor may be programmable.

When the total current through programmable source-follower transistors 40, 42, . . . 44 is reduced, a higher voltage drop occurs from VCC to V_ANODE. The lower V_ANODE may provide more compensation, resulting in a faster fall time. When the total current through programmable source-follower transistors 40, 42, . . . 44 is increased, a smaller voltage drop occurs from VCC to V_ANODE, providing less compensation.

Thus the fall time may be adjusted by a programmable amount. A programmable edge-compensation stage is provided by switches 50, 52, . . . 54, programmable source-follower transistors 40, 42, . . . 44, and programmable mirror source-follower transistors 41, 43, . . . 45.

A differential data input signal IN+, IN− controls switching VCSEL 10 on and off. This differential data input signal IN+, IN− is amplified by pre-amp 36 and then conditioned by signal conditioning 38 to generate differential control signals VG+, VG−, applied to the driver transistors, cathode driver transistor 16 and mirror driver transistor 26. Signal conditioning 38 also generates differential control signals VH+, VH−, applied to programmable source-follower transistors 40, 42, . . . 44 and to programmable mirror source-follower transistors 41, 43, . . . 45.

Figure 9:
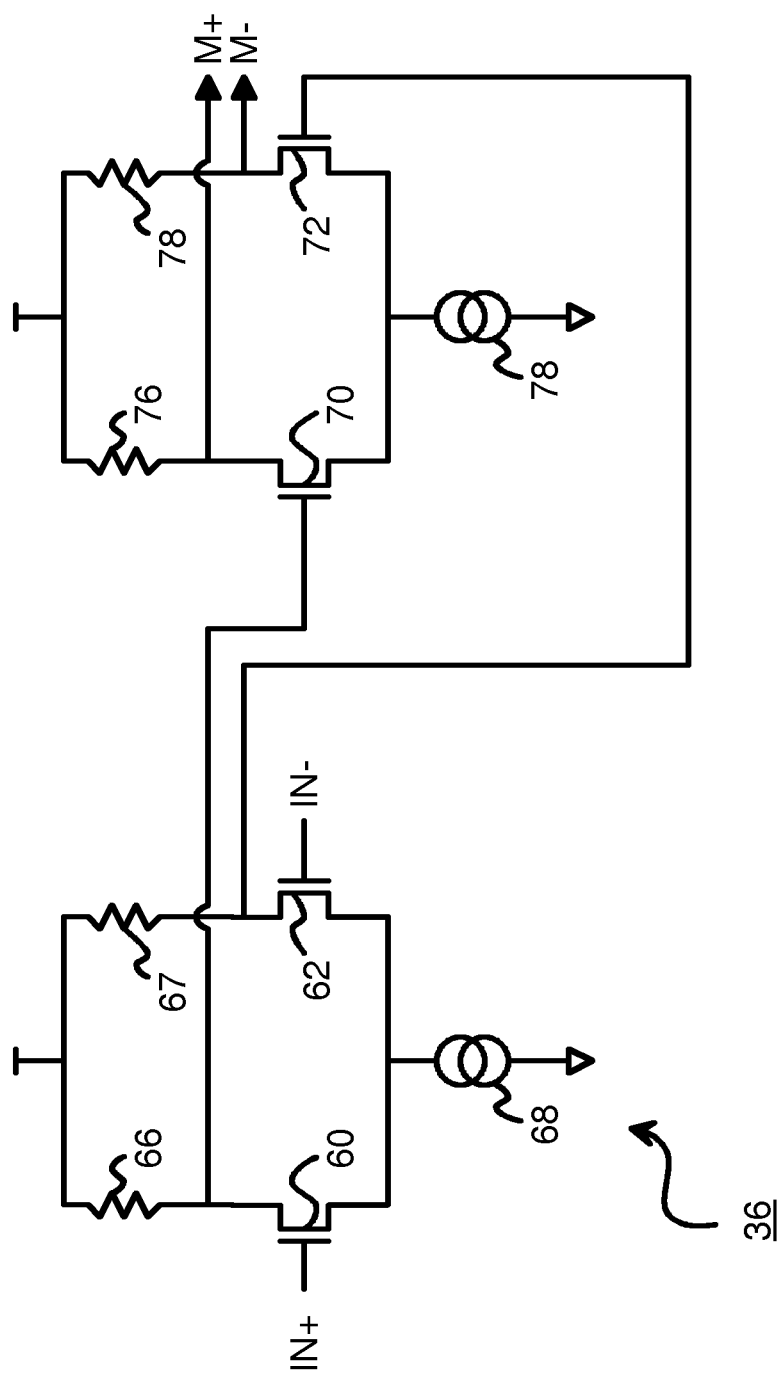
FIG. 9 is a schematic of a pre-amplifier.

FIG. 9 is a schematic of a pre-amplifier. Pre-amp 36 has two stages. Differential input IN+, IN− is amplified by Current-Mode Logic (CML) to a sufficient level of middle signals M+, M− that are sent to signal conditioning 38.

In the first differential stage, differential inputs IN+, IN− are applied to the gates of driver transistors 60, 62, which have sources connected together and to current source 68. Load 66 connects to the drain of driver transistor 60 and drives the gate of second-stage driver transistor 70. Load 67 connects to the drain of driver transistor 62 and drives the gate of second-stage driver transistor 72.

In the second stage, second-stage driver transistors 70, 72 have sources connected together and to current source 7. Load 76 connects to the drain of driver transistor 70 and drives middle signal M+. Load 78 connects to the drain of driver transistor 72 and drives middle signal M−.

Figure 10:
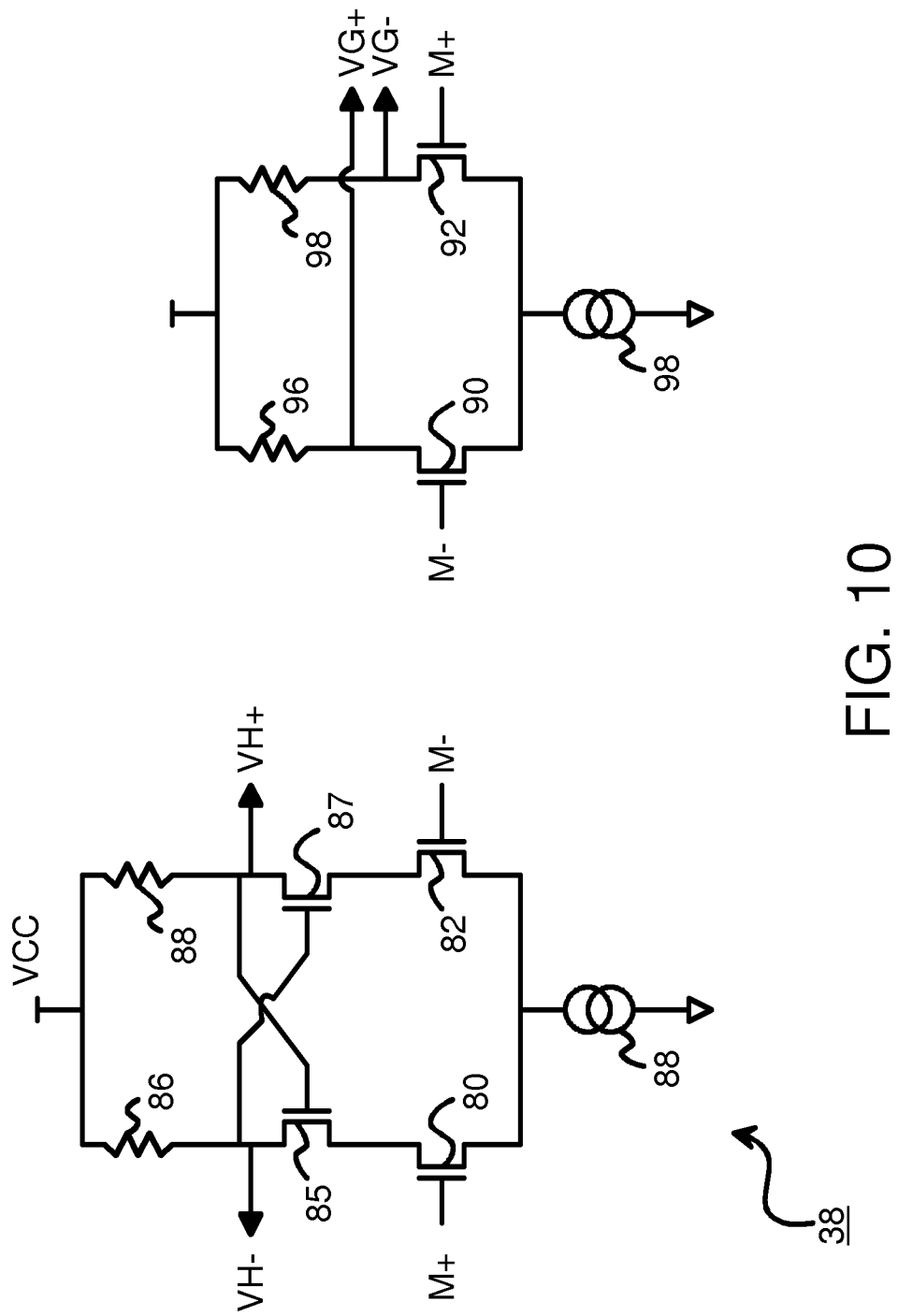
FIG. 10 is a schematic of a signal conditioning circuit.

FIG. 10 is a schematic of a signal conditioning circuit. Signal conditioning 38 matches delays in both paths and re-established D.C. or common-mode levels to properly bias transistors such as cathode driver transistor 16 and source-follower transistor 20. Signal conditioning 38 receives differential middle signals M+, M− from pre-amp 36 and generates control signals VG+, VG− and VH+, VH−. The common-mode voltage of VH+, VH− is higher than the common-mode voltage of VG+, VG− since the gate of source-follower transistor 20 is biased higher than the gate of cathode driver transistor 16.

The lower control signal VG+ is generated from the drain node of differential transistor 90, which receives middle signal M− on its gate. Load 96 also connects to VG+. The other lower control signal VG− is generated from the drain node of differential transistor 92, which receives middle signal M+ on its gate. Load 98 also connects to VG−. The sources of differential transistors 90, 92 are connected together and to current source 98.

The upper control signal VH+, used as the gate control of source-follower transistor 20, is generated as the gate voltage of cross-over transistor 85, which is the drain node of cross-over transistor 87 and also connected to load 88. The other upper control signal VH− is generated as the gate voltage of cross-over transistor 87, which is the drain node of cross-over transistor 85 and also connected to load 86.

The source of cross-over transistor 85 is connected to the drain of differential transistor 80, which receives M+ on its gate. The source of cross-over transistor 87 is connected to the drain of differential transistor 82, which receives M− on its gate. The sources of differential transistors 80, 82 are connected together and to current source 88.

Figure 1A:
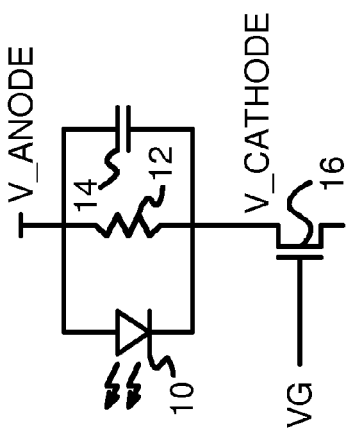
FIGS. 1A-1B show a common-anode VCSEL driver.
Figure 1B:
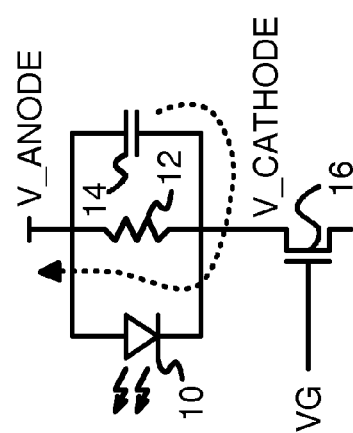
Figure 11A:
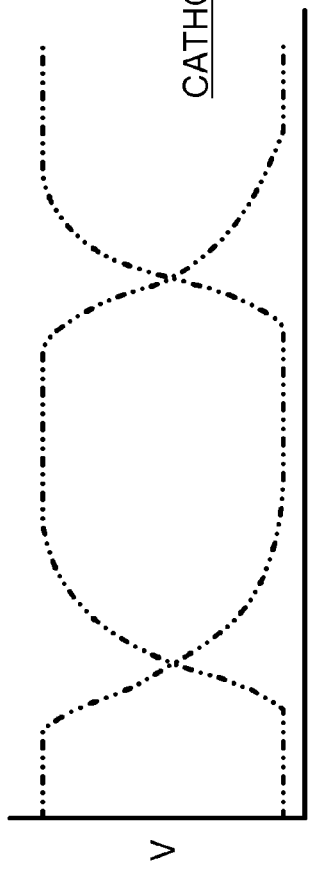
FIGS. 11A-C are eye diagrams showing an improvement in fall time using 2-terminal modulation rather than 1-terminal modulation.
Figure 11B:
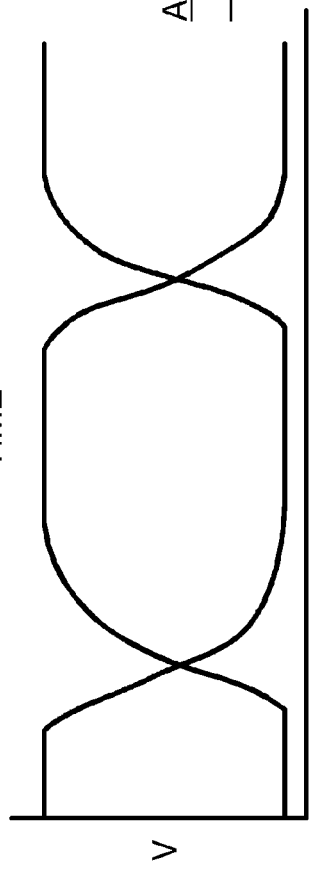
Figure 11C:
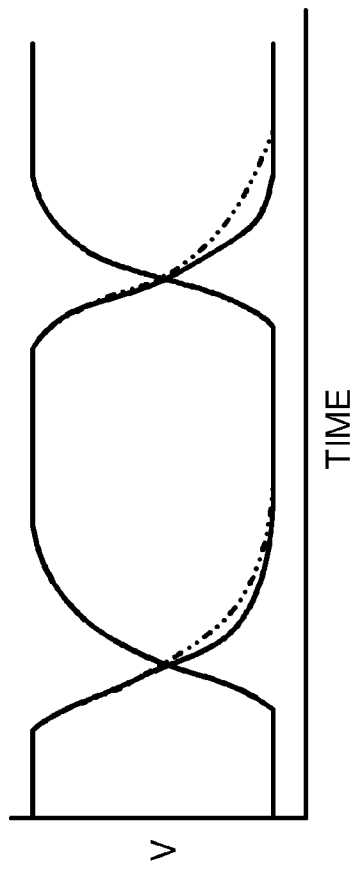

FIGS. 11A–C are eye diagrams showing an improvement in fall time using 2-terminal modulation rather than 1-terminal modulation. In FIG. 11A, 1-terminal modulation is simulated where only the cathode voltage is modulated while the anode voltage is fixed. The fall time is slow.

Figure 2A:
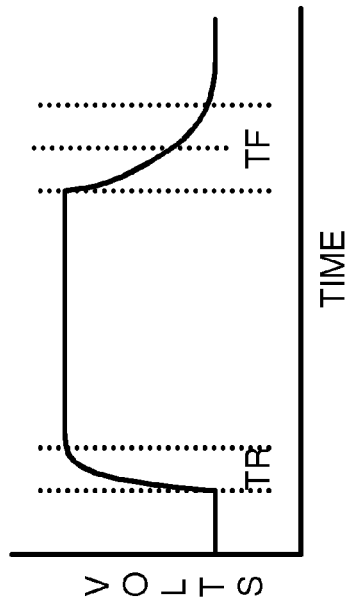
FIGS. 2A-B show the effects modeled by the parasitic capacitor and resistor in a VCSEL.
Figure 2B:
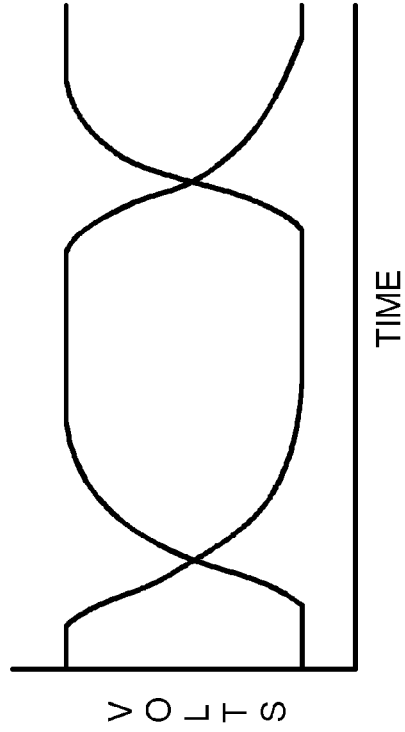

In FIG. 11B, 2-terminal modulation is simulated. Both the anode and cathode voltages are modulated, such as by source-follower transistor 20 and cathode driver transistor 16 of FIG. 7. This dual modulation of both cathode and anode results in a smaller fall time. In FIG. 11C, the eye diagrams of FIGS. 11A and 11B are superimposed. The fall time for anode and cathode modulation is less than for cathode-only modulation. Thus 2-terminal modulation improves fall times for a VCSEL driver circuit.

Alternate Embodiments

Several other embodiments are contemplated by the inventor. For example, while n-channel transistors have been shown, the circuits could be flipped over and p-channel transistors substituted. The laser diode could be external to the laser driver circuit or they could be integrated together.

N-channel transistors have been shown. The substrate or bulk connections may be tied to the highest voltage, such as VCC, or to a substrate or back-bias voltage, or to the transistor sources. Other kinds of circuits for pre-amp 36 and signal conditioning 38 could be substituted.

The current source could be implemented as n-channel transistors having gates receiving a fixed voltage. Rather than have a separate bias current generator, cathode driver transistor could be biased so that it remains slightly on in the off state. Then both the bias and modulating currents would flow through cathode driver transistor 16, however current may be wasted in this alternative.

Rather than transition at the same time, VG and VH could be skewed relative to each other. Rather than turn completely off, some sub-threshold current may still flow through components that are considered "off", such as VCSEL 10, cathode driver transistor 16, or source-follower transistor 20. The current may be reduced rather than turned off completely. For example, the current through transistors 16, 20 may be reduced by 90%, 95%, or 99% rather than by exactly 100%.

Rather than use switches 50, 52, . . . 54, the gate control signal VH+ to each of programmable source-follower transistors 40, 42, . . . 44 could be gated with the configuration signal. The gate control signal of a non-enabled programmable source-follower transistors 40, 42, . . . 44 could be driven low to disable the transistor regardless of VH+. Programmable mirror source-follower transistors 41, 43, . . . 45 could be disabled in a similar way. The sizes of programmable source-follower transistors 40, 42, . . . 44 could all be the same, or differing sizes could be used, such as binary-weighted sizes.

The waveforms such as FIGS. 3, 6 are not to scale. VH may be higher in absolute volts and may have a wider voltage swing than VG yet still have the basic waveform shape shown. Actual waveforms may have rounded rather than abrupt changes, glitches, resonant ringing, and other secondary effects.

Various theories of operation have been presented to try to explain operation of a physical VCSEL device. These theories are approximations of real, often complex, physical behaviors. These theories may be incorrect, although useful for designing driver circuits. The invention is not limited by these theories and does not depend on these theories being correct. For example, the causes of frequency chirping may be more complex than described by the simple theory of parasitic capacitor 14 being discharged.

The circuit designer may choose resistors, capacitors, transistors, and other components to have a ratio that produces the desired voltages. While Complementary-Metal-Oxide-Semiconductor (CMOS) transistors have been described, other transistor technologies and variations may be substituted, and materials other than silicon may be used, such as Galium-Arsenide (GaAs) and other variations. DMOS, LDMOS, and diffusion-enhanced transistors may be used. Bipolar transistors could also be used, such as an emitter-follower for source-follower transistor 20.

Timings may be adjusted by adding delay lines or by controlling delays in leading-edge blocking units. Pulse generators could also be added. The outputs or control signals may be swapped to add an inversion. Inverting and non-inverting inputs may be swapped and the polarity of the output reversed.

Separate power supplies and grounds may be used for some components. The bulk or substrate nodes may be tied to power for p-channel transistors, and to ground for n-channel transistors, or a substrate bias generate be used to generate bulk voltages. Various filters could be added. Active low rather than active high signals may be substituted. The signals applied to the gates of p-channel and n-channel transistors may be switched to power or ground to power down the circuit.

While positive currents have been described, currents may be negative or positive, as electrons or holes may be considered the carrier in some cases. Source and sink currents may be interchangeable terms when referring to carriers of opposite polarity. Currents may flow in the reverse direction.

The high voltage supply could be VCC for all circuits, or multiple high power supplies could be used. For example, and external or I/O VCC of 3.3 volts could be used for portions of the circuits that drive VCSEL 10, while a lower internal VDD could be used for other transistors, such as for mirror source-follower transistor 22, pre-amp 36, or the lower control voltage (VG) portions of signal conditioning 38. VDD could be as low as 1 volt when VCC is 3.3 volts.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A two-terminal-modulating laser diode driver comprising:
    an anode connection for connecting to an anode terminal of a laser diode;
    a cathode connection for connecting to a cathode terminal of the laser diode;
    wherein the laser diode has a turn-off time that is longer than a turn-on time;
    a source-follower transistor connected to conduct an anode current between a power supply and the anode connection;
    a first control signal applied to a gate of the source-follower transistor for modulating the anode current;
    a cathode driver transistor connected to conduct a modulating current between the cathode connection and a source node;
    a second control signal applied to a gate of the cathode driver transistor for modulating the modulating current; and
    a signal generator, receiving an input signal that indicates when the laser diode is to be turned on to illuminate, and when the laser diode is to be turned off to not illuminate, the signal generator activating the first control signal and the second control signal when the input signal indicates that the laser diode is to be turned on, the signal generator de-activating the first control signal and the second control signal when the input signal indicates that the laser diode is to be turned off;
    a bias current generator, coupled to the cathode connection, for drawing a bias current through the laser diode;
    wherein the bias current flowing through the laser diode is insufficient to illuminate the laser diode and is smaller than the modulating current;
    wherein the bias current sets an operating point for the laser diode and for the source-follower transistor, wherein the bias current is also drawn through the source-follower transistor in series with the laser diode;
    wherein the source-follower transistor is modulated to conduct the anode current when the input signal indicates that the laser diode is to be turned on, and to not conduct the anode current when the input signal indicates that the laser diode is to be turned off;
    wherein the cathode driver transistor is modulated to conduct the modulating current when the input signal indicates that the laser diode is to be turned on, and to not conduct the modulating current when the input signal indicates that the laser diode is to be turned off,
    wherein both the cathode terminal and the anode terminal of the laser diode are modulated and whereby the laser diode and source-follower transistor are biased to the operating point by the bias current.

2. The two-terminal-modulating laser diode driver of claim 1 wherein a first gate voltage of the first control signal is driven to a high value when the input signal indicates that the laser diode is to be turned on, and to a low value that is less than the high value when the input signal indicates that the laser diode is to be turned off;
    wherein a second gate voltage of the second control signal is driven to a second high value when the input signal indicates that the laser diode is to be turned on, and to a second low value that is less than the second high value when the input signal indicates that the laser diode is to be turned off;

whereby gate voltages are driven high and low for both the source-follower transistor and for the cathode driver transistor to modulate both cathode and anode terminal of the laser diode.

3. The two-terminal-modulating laser diode driver of claim 1 wherein the laser diode has a parasitic capacitor between the anode terminal and the cathode terminal, wherein the parasitic capacitor is charged when the laser diode is turned on;

wherein the parasitic capacitor is discharged at both the anode terminal by the source-follower transistor modulating the anode current, and at the cathode terminal by the cathode driver transistor modulating the modulating current, whereby the parasitic capacitor is discharged from both anode and cathode terminals.

4. The two-terminal-modulating laser diode driver of claim 1 wherein the turn-off time of the laser diode is reduced compared to the turn-off time of the laser diode when the anode terminal is connected to a fixed voltage that is not modulated.

5. The two-terminal-modulating laser diode driver of claim 1 wherein the turn-off time of the laser diode is reduced by half when both the anode connection and the cathode connection are modulated, compared with modulating only the cathode connection and holding the anode connection at a fixed voltage.

6. The two-terminal-modulating laser diode driver of claim 1 wherein the laser diode is a Vertical-Cavity Surface-Emitting Laser (VCSEL) diode.

7. The two-terminal-modulating laser diode driver of claim 1 further comprising:

a modulating current source for generating the modulating current, the modulating current generator connected to a source of the cathode driver transistor;

a mirror driver transistor having a gate receiving a differential complement of the second control signal, the mirror driver transistor having a source connected to the modulating current source and a drain connected to a dummy load;

a mirror source-follower transistor having a gate receiving a differential complement of the first control signal, the mirror source-follower transistor having a source connected to the power supply and a drain connected to the dummy load;

wherein the modulating current is switched to flow through the mirror source-follower transistor, the dummy load, and the mirror driver transistor when the input signal indicates that the laser diode is to be turned off.

8. The two-terminal-modulating laser diode driver of claim 7 further comprising:

a plurality of the source-follower transistor that are connected in parallel to each other, wherein each source-follower transistor in the plurality of source-follower transistors is selectably enabled or disabled by a programmable value; wherein the anode current is a sum of currents flowing through source-follower transistors that are enabled by the programmable value without including currents from source-follower transistors that are not enabled by the programmable value;

wherein the anode current is adjustable by the programmable value.

9. The two-terminal-modulating laser diode driver of claim 8 further comprising:

a plurality of switches, controlled by the programmable value, each switch connecting a source of a source-follower transistor in the plurality of source-follower transistors to the power supply, wherein a switch in the plurality of switches is closed when the source-follower transistor in series with the switch is enabled, and open when the source-follower transistor in series with the switch is disabled, whereby source-follower transistors are switched to adjust the anode current.

10. The two-terminal-modulating laser diode driver of claim 8 further comprising:

a plurality of the mirror source-follower transistor that are connected in parallel to each other, wherein each mirror source-follower transistor in the plurality of mirror source-follower transistors is selectably enabled or disabled by the programmable value.

11. A two-terminal-modulating laser diode driver comprising:

an anode connection for connecting to an anode terminal of a laser diode;

a cathode connection for connecting to a cathode terminal of the laser diode;

wherein the laser diode has a turn-off time that is longer than a turn-on time;

a source-follower transistor connected to conduct an anode current between a power supply and the anode connection;

a first control signal applied to a gate of the source-follower transistor for modulating the anode current;

a cathode driver transistor connected to conduct a modulating current between the cathode connection and a source node;

a second control signal applied to a gate of the cathode driver transistor for modulating the modulating current;

a signal generator, receiving an input signal that indicates when the laser diode is to be turned on to illuminate, and when the laser diode is to be turned off to not illuminate, the signal generator activating the first control signal and the second control signal when the input signal indicates that the laser diode is to be turned on, the signal generator de-activating the first control signal and the second control signal when the input signal indicates that the laser diode is to be turned off;

wherein the source-follower transistor is modulated to conduct the anode current when the input signal indicates that the laser diode is to be turned on, and to not conduct the anode current when the input signal indicates that the laser diode is to be turned off;

wherein the cathode driver transistor is modulated to conduct the modulating current when the input signal indicates that the laser diode is to be turned on, and to not conduct the modulating current when the input signal indicates that the laser diode is to be turned off, wherein both the cathode terminal and the anode terminal of the laser diode are modulated;

a pre-amplifier, receiving the input signal, for amplifying the input signal to generate a middle signal; and a signal conditioning circuit, receiving the middle signal, for generating the first control signal and the second control signal, wherein a common-mode voltage of the first control signal is larger than a common-mode voltage of the second control signal.

12. A laser diode driver comprising:

an on/off signal indicating when a laser diode is turned off and when the laser diode is turned on;

an anode terminal to a laser diode;

a cathode terminal to the laser diode;

a source-follower transistor having a channel for conducting a first current to the anode terminal, and having a first gate receiving a first control signal;

wherein the first control signal is varied in response to the on/off signal to vary an anode voltage of the anode terminal; and a cathode driver transistor having a channel for conducting a modulating current from the cathode terminal to a source node in response to a second gate receiving a second control signal;

wherein the second control signal is varied in response to the on/off signal to vary a cathode voltage of the cathode terminal;

wherein when the on/off signal transitions to an off state, the anode voltage is lowered and the cathode voltage is raised until a voltage drop through the laser diode is less than a turn-on voltage for the laser diode;

wherein an effective channel size of the source-follower transistor is programmable by selectively enabling from among a plurality of transistor channels in parallel;

wherein a degree of compensation is programmable by selectively enabling the plurality of transistor channels in parallel;

whereby both anode and cathode voltages are changed to turn off the laser diode.

13. The laser diode driver of claim 12 further comprising:

a mirror source-follower transistor having a channel for conducting a mirror current to a first dummy node in response to a gate receiving a differential complement of the first control signal;

a dummy load connected between the first dummy node and a second dummy node;

a mirror cathode driver transistor having a channel for conducting the mirror current from the second dummy node to the source node in response to a differential complement of the second control signal;

a current source, coupled between the source node and a ground;

wherein current is switched between the cathode driver transistor and the mirror cathode driver transistor in response to the second control signal and the differential complement of the second control signal.

14. The laser diode driver of claim 13 further comprising:

a bias current source, coupled to the cathode terminal, for drawing a bias current through the laser diode and through the source-follower transistor.

15. The laser diode driver of claim 14 further comprising:

wherein the bias current source is a variable current source that is adjustable to adjust the bias current for different kinds of laser diodes having different operating specifications.

16. A dual-sided discharging laser-diode driver comprising:

an anode terminal for connecting to an anode of a laser diode;

a cathode terminal for connecting to a cathode of the laser diode;

source-follower transistor means for modulating an anode current to the anode terminal in response to a first control signal;

cathode driver transistor means for switching a modulating current from the cathode terminal to a tail node in response to a second control signal;

a modulating current source for drawing the modulating current from the tail node;

mirror driver transistor means for switching the modulating current to a dummy load when the second control signal switches off the modulating current through the cathode driver transistor means; and a bias current source for drawing a bias current from the cathode terminal;

wherein a cathode voltage of the cathode terminal rises and an anode voltage of the anode terminal falls when the first control signal and the second control signal are switched to an inactive state, wherein the laser diode is switched off during the inactive state, whereby both terminals are modulated to turn off the laser diode.

17. The dual-sided discharging laser-diode driver of claim 16 wherein the source-follower transistor means comprises a plurality of transistor channels in parallel;

switch means for selecting which transistor channels in the source-follower transistor means are enabled to respond to the first control signal and which transistor channels are disabled so that they do not contribute to the anode current regardless of the first control signal;

programmable means for controlling the switch means to generate a target anode current in response to a programmable digital value;

wherein the anode current is adjustable by the programmable digital value.

18. The dual-sided discharging laser-diode driver of claim 16 wherein the laser diode is a Vertical-Cavity Surface-Emitting Laser (VCSEL) having a parasitic capacitor between the anode terminal and the cathode terminal, the parasitic capacitor delaying a turn-off time of the laser diode;

wherein the turn-off time of the laser diode is reduced by the cathode voltage rising and the anode voltage falling when the first control signal and the second control signal are switched to the inactive state, whereby turn-off time is reduced by modulating both the anode voltage and the cathode voltage.

* * * * *